United States Patent [19]
Takahashi et al.

[11] Patent Number: 5,804,859
[45] Date of Patent: Sep. 8, 1998

[54] POWER SEMICONDUCTOR DEVICE HAVING OVER-CURRENT PROTECTION

[75] Inventors: Hitoshi Takahashi; Yosuke Takagi, both of Kanagawa, Japan

[73] Assignee: Kabushiki Kaisha Toshiba, Kawasaki, Japan

[21] Appl. No.: 668,233

[22] Filed: Jun. 21, 1996

[30] Foreign Application Priority Data

Jun. 23, 1995 [JP] Japan ..................... 7-157260

[51] Int. Cl.$^6$ .................................. H01L 23/62
[52] U.S. Cl. ................. 257/355; 257/356; 257/357; 257/358
[58] Field of Search ...................... 257/328, 355, 257/356, 357, 358, 359, 360, 361, 362

[56] References Cited

U.S. PATENT DOCUMENTS 5,530,271  6/1996  Fallica ........................ 257/355
5,581,103  12/1996  Mizukami .................... 257/355

*Primary Examiner*—Carl W. Whitehead
*Attorney, Agent, or Firm*—Oblon, Spivak, McClelland, Maier & Neustadt, P.C.

[57] ABSTRACT

A semiconductor device having an input terminal and an output terminal includes at least one high power device for supplying output current as an output section, and over-current limiting circuits, each including a over-current detection circuit, for limiting the amount of each current flowing through a plurality of bonding wires by which the output terminal is connected to an external terminal, to a current value of a desired amount or less. Thereby, an over-current condition where the current value is over an allowable current value, is avoided and blowing the bonding wire of the device can be prevented.

16 Claims, 5 Drawing Sheets

POWER SEMICONDUCTOR DEVICE HAVING OVER-CURRENT PROTECTION

BACKGROUND OF THE INVENTION

1. Field of the Invention

The present invention relates to a semiconductor device used for large amount power applications such as an application to switch a heavy current flow, for example.

2. Description of the Background

In general, in power semiconductor devices used for large amount power applications such as a power conversion of Alternating Current (AC) into Direct Current (DC) and a frequency conversion, there is a power semiconductor device having the configuration that a plurality of bonding wires, as output conducting wires through which an output terminal of the power semiconductor device is connected to an external terminal, are connected between the same output terminal and the external terminal in order to have an enlarged current capacity.

The output section of such a power semiconductor device has the following configuration, for example. Hereinafter, we will explain the configuration and operation of a conventional power semiconductor device with reference to FIGS. 7 to 9.

FIG. 7 is a perspective view showing a schematic configuration of a conventional power semiconductor device as a first conventional example. FIG. 8 is a circuit diagram showing an output section of the conventional power semiconductor device shown in FIG. 7. FIG. 9 is a circuit diagram of an output section of a power semiconductor device as a second conventional example.

First, the configuration of the power semiconductor device as the first conventional example will be explained. In FIGS. 7 and 8, a reference number 1 designates the output section of the power semiconductor device, a reference number 2 denotes a semiconductor chip. A reference number 3 indicates a power metal oxide semiconductor field effect transistor (hereinafter referred to as "a power MOS FET") as a power semiconductor element. Reference characters 4a, 4b and 4c designate output pads as the output terminals of the power MOS FET 3. A reference number 5 denotes an input terminal of the power MOS FET 3. A reference number 6 designates an external terminal in the output section 1 of the conventional semiconductor device.

In addition, reference characters 7a, 7b and 7c designate bonding wires as output conducting wires through which the output pads 4a, 4b and 4c are electrically connected to the output terminal 6. Both ends of each bonding wire 7a to 7c are connected to the output pads 4a to 4c and the output terminal 6, respectively. As shown in FIG. 7, because the plurality of wires are used as the bonding wires 7a to 7c, the resistance of the bonding wires can be decreased and an adequate current capacity of the bonding wires can be kept.

When each of the bonding wires 7a, 7b and 7c performs correctly and each bonding wire has a small current capacity, the maximum current flow for the semiconductor device can be divided into a plurality of uniformly small current flows, then each small current flows through the each bonding wire.

The bonding wires 7a, 7b and 7c are formed so that two bonding wires in the bonding wires 7a to 7c are blown If a heavy current whose value is over the maximum allowable current value of a semiconductor device flows through the bonding wires 7a, 7b and 7c.

For the conventional semiconductor device having the configuration described above, a test operation for checking whether or not it satisfies a desired specification is performed before it is mounted on a system and the like.

During this test operation a testing current having a current value which is smaller than that of an ordinal current value flows through the bonding wires 7a, 7b and 7c connected between the output pads 4a, 4b and 4c and the external terminal 6. After the completion of the test operation, the semiconductor device is mounted on a device, a system, and the like.

However, for example, if the bonding wire 7a is blown by an accident during a device mounting process in which the semiconductor device is mounted on a system, or if one end of the bonding wire 7a is electrically disconnected from the output pad 4a or the external terminal 6, no current flows through the bonding wire 7a and the current flows through only both the bonding wires 7b and 7c in the normal operation of the conventional semiconductor device.

In this case, when the current having the maximum current value flows in the conventional semiconductor device, a current whose value is the maximum allowable current value flows through the bonding wires 7b and 7c. As a result, both or one of the bonding wires 7b and 7c are blown in order or at the same time, so that the device is destroyed, for example, and the system or device incorporating the semiconductor device is rendered inoperative.

Furthermore, in order to detect a faulty area in the connection sections between the bonding wires 7a, 7b and 7c and the output pads 4a, 4b and 4c or the bonding wires 7a, 7b and 7c and the external terminal 6 before mounting of the semiconductor device on the system or the like, it is required to check the state of the connection sections in the semiconductor device by using a X-ray photographing device. This increases the number of fabrication processes and the process time therefor. This is one of problems involved in the fabrication processes of power semiconductor devices.

Next, the configuration and the operation of the semiconductor device as the second conventional example will be explained.

In FIG. 9, a reference number 8 designates an output section of the conventional semiconductor device, a reference number 9 denotes an over-current detection and protective circuit incorporated between the gate electrode and the source electrode of the power MOS FET 3. This over-current detection and protective circuit 9 generates a control signal corresponding to a current value at the source electrode and transfers the control signal to the gate electrode in order to limit the current value flowing through the source electrode.

In the test operation in order to detect a faulty section in the conventional semiconductor device having the above configuration during the fabrication processes, similar to the conventional semiconductor device of the first conventional example, a current whose value is smaller than that of a normal current used during a normal operation is used. After the completion of the test operation, the semiconductor device is mounted on a device or a system and then operated.

In the normal operation mode of the conventional semiconductor device, as shown in FIG. 9, before flowing of the current exceeds an allowable current value, the current is limited by the over-current detection and protective circuit 9 so that no bonding wires 7a, 7b and 7c are blown and no device or system incorporating the semiconductor device is rendered inoperative.

However, in the conventional semiconductor device as shown in FIG. 9, for example, when one of the bonding wires 7a, 7b and 7c is cut or electrically disconnected from the bonding pads 4a, 4b and 4c or from the external terminal 6 during the normal operation by an accident, namely no current flows through the bonding wire 7a, the current flows through only the bonding wires 7b and 7c to perform the operation of the semiconductor device.

Like the semiconductor device of the first conventional example, as shown in FIGS. 7 and 8, when the current whose current value is approximately equal to the allowable current value flows through the bonding wires 7b and 7c, not through the bonding wire 7a, the amount of the current reaches an over-current value or more for the bonding wires 7b and 7c. In this case, the bonding wires 7b and 7c or one of them, is blown. This stops of the operation of the device or the system incorporating this semiconductor device. Therefore this causes a device fatality problem. In addition, in order to detect a faulty part in the connection sections between the bonding wires 7a, 7b and 7c and the output pads 4a, 4b and 4c or the external terminal 6 in the semiconductor device during the testing process before the mounting process, it is required to use a X-ray photographic device to observe the faulty part, so that the number of processes is increased and it takes a long time to perform the fabrication processes. This is also a problem.

As described above, in the conventional semiconductor devices used for large amount power applications, if at least one bonding wire in the plurality of bonding wires is cut during the normal operation mode by an unexpected event, or if the bonding wire is disconnected from the output pad or the external terminal, and in this case, when a normal current, whose current value is not more than an allowable current value in the normal operation, flows through the bonding wires that are not cut and connected correctly to the bonding pads and the external terminal, these correctly-connected bonding wires will be blown because the current value reaches an over-current value. Thereby, a device or a system incorporating this semiconductor device will cause to operate. In addition, there is a drawback that the number of fabrication processes is increased and the fabrication time is increased when the testing operation in order to check faulty parts in a semiconductor device is carried out before the mounting process to mount the semiconductor device onto a system.

SUMMARY OF THE INVENTION

Accordingly, an object of the present invention is, with due consideration to the drawbacks of the conventional semiconductor device used for large amount power applications, to provide a semiconductor device which is capable of preventing an over-current from flowing through bonding wires and thus preventing a device or a system mounting the semiconductor device from becoming inoperative. In addition, the semiconductor device is also capable of detecting faulty parts around electrical connection sections between the bonding wires, bonding pads and external terminals.

In accordance with a preferred embodiment of the present invention, a semiconductor device having an input terminal and an output terminal, may comprise at least one power semiconductor element for supplying output current as an output section of the semiconductor device, and over-current limiting means for limiting an amount of a current flowing through a plurality of output conducting wires by which the output terminal is electrically connected to an external terminal, to a current value of a desired amount or less.

In addition, in the semiconductor device described above, the over-current limiting means may comprise current detection means for detecting an amount of the current flowing through the plurality of output conducting wires and protective circuit means for receiving output transferred from the current detection means and for controlling the amount of an output current of the power semiconductor element according to the output from the current detection means so that the amount of the current flowing through the plurality of output conducting wires becomes the desired amount or less.

Further, in the semiconductor device described above, the protective circuit means in the over-current limiting means may comprise a first conductivity type MOS FET whose source is connected to the input terminal and whose drain is connected to a ground, and a second conductivity type MOS FET whose source is connected to the power semiconductor element and whose gate is connected to the power semiconductor element and the ground through resistive elements and the current detection means in the over-current limiting means comprises the resistive elements.

In addition, in the semiconductor device described above, the first conductivity type MOS FET can be a P-type MOS FET and the second conductivity type MOS FET can be a N-type MOS FET.

Further, in the semiconductor device described above, the over-current limiting means may be incorporated for each of the plurality of power semiconductor elements.

In addition, the semiconductor device described above may be configured such that the output terminal of the power semiconductor element is the source terminal, the input terminal of the power semiconductor element is the gate terminal, and the drain terminal of the power semiconductor element is connected to a high voltage power source.

In addition, in the semiconductor device described above, each output terminal of each of the plurality of power semiconductor elements may be electrically connected to each of the plurality of output conducting wires.

Further, in the semiconductor device described above, each output terminal of the plurality of power semiconductor elements may be connected to at least two output conducting wires or more, and the over-current limiting means detects each of the currents flowing through these two or more output conducting wires.

In addition, the semiconductor device described above may be configured such that the output terminal of the power semiconductor element is the drain terminal and the input terminal is the gate terminal of the power semiconductor element, and the source terminal and the gate terminal of the power semiconductor element are connected to the over-current limiting means. The semiconductor device described above may also be configured such that the output terminals of the power semiconductor element are the drain terminal and the source terminal, and the over-current limiting means detects the amount of the current flowing through the output conducting wire connected to the output terminal of the source terminal side.

In addition, in the semiconductor device described above, each of the plurality of power semiconductor elements may be made up of a power MOS FET, a bipolar transistor, or an insulated gate bipolar transistor (IGBT).

In each of the semiconductor devices having the configurations described above, the amount of a current flowing through each of the output conducting wires (bonding wires), each connecting the output terminal of the power semiconductor element to the external terminal, can be limited to a desired amount of the current or less by controlling each of the over-current limiting sections.

In general, if there is a faulty one in the plurality of output conducting wires (in the bonding wires), the amount of the current flowing through the output conducting wires having no fault is increased.

Conversely, in the semiconductor devices of the present invention having the configurations described above, the burn-out of the output conducting wires (bonding wires) from an over-current flow can be prevented, because the amount of current flowing through each output conducting wire can be limited so that the amount of the current remains within the desired current value even if there are faulty wires such as a disconnection (burn-out) or a faulty connection in the plurality of the output conducting wires. Thereby, the stopping of the operation of a device or a system incorporating the semiconductor device of the present invention can be avoided.

In addition, when the semiconductor device of the present invention is checked in operation by using a current having a relatively larger current value that is nearly equal to the maximum allowable current value during a testing process, because the over-current limiting section in the semiconductor device can check whether or not the current value flowing through the output conducting wire is over a desired current value, it can easily detect any faulty output conducting wire.

BRIEF DESCRIPTION OF THE DRAWINGS

These and other objects, features, aspects and advantages of the present invention will become more apparent from the following detailed description of the preferred embodiments of present invention taken in conjunction with the accompanying drawings.

DESCRIPTION OF THE PREFERRED EMBODIMENTS

Other features of the present invention will become apparent through the following description of preferred embodiments which are given for illustration of the present invention and are not intended to be limiting thereof.

Hereinafter, we will explain preferred embodiments of the present invention with reference to the accompanying drawings.

Embodiment 1.

Figure 1:
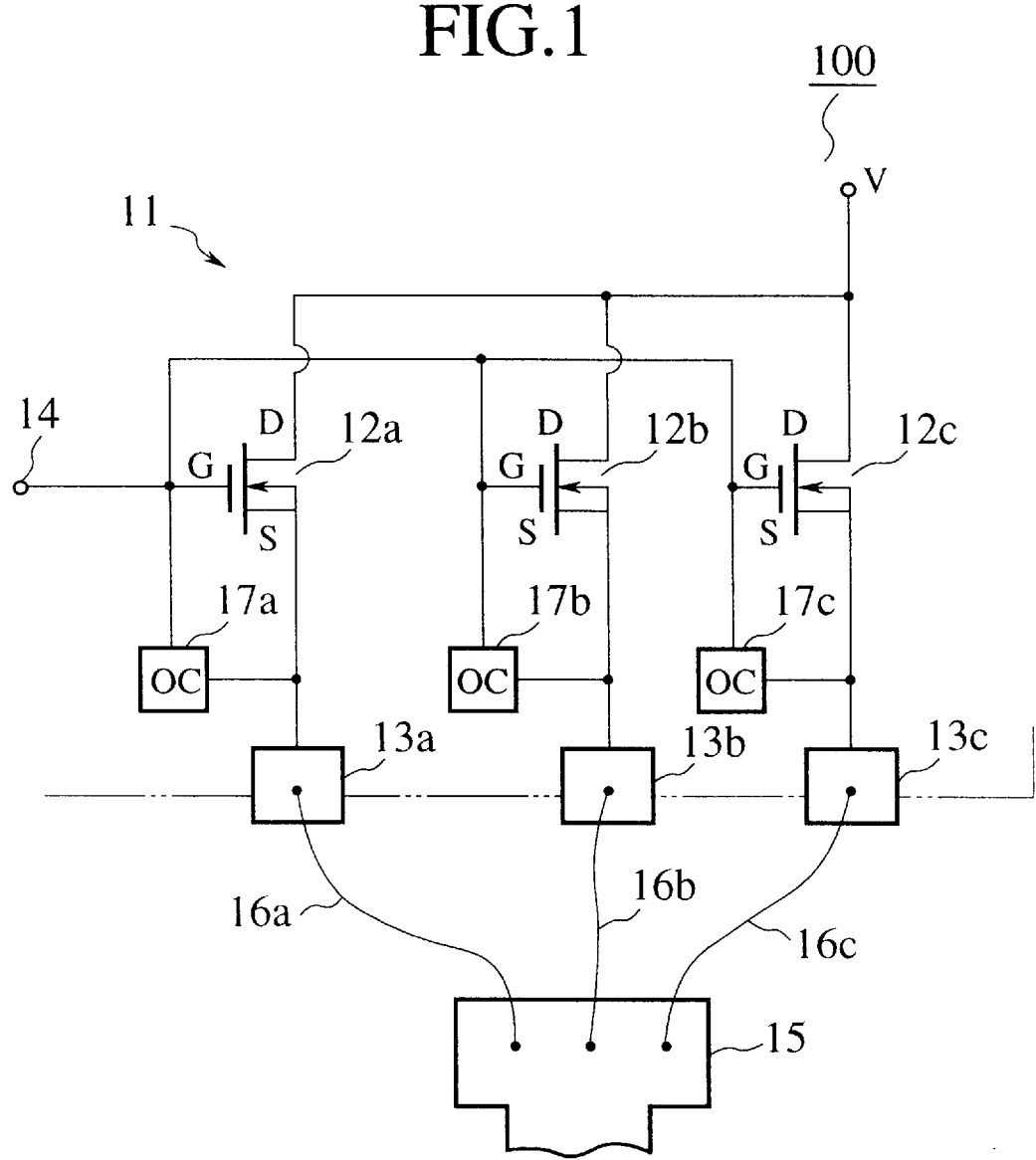
FIG. 1 is a circuit diagram showing a main part and a peripheral part of an output section in a semiconductor device of the first embodiment according to the present invention.
Figure 2:
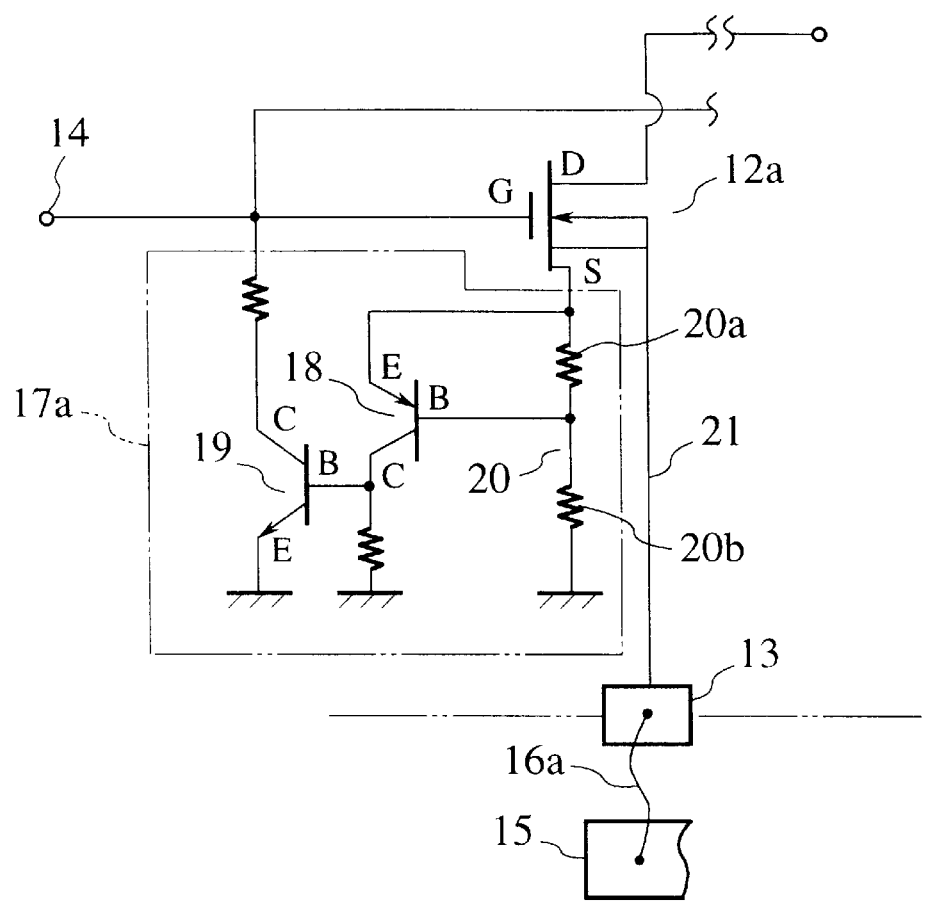
FIG. 2 is a detailed circuit diagram of the main part and the peripheral part of the output section in the semiconductor device of the first embodiment, as shown in FIG. 1.

First, we will explain a semiconductor device as a first embodiment according to the present invention with reference to FIGS.1 and 2.

FIG. 1 is a circuit diagram showing a main part and a peripheral part of an output section in the semiconductor device of the first embodiment according to the present invention. FIG. 2 is a detailed circuit diagram of the main part and the peripheral part of the output section in the semiconductor device of the first embodiment shown in FIG. 1.

In FIGS.1 and 2, a reference number 11 designates an output section of the semiconductor device 100 of the first embodiment. The output section 11 comprises three power metal oxide semiconductor field effect transistors 12a, 12b and 12c (hereinafter the word "metal oxide semiconductor field effect transistors" will be referred to as "MOS FET") connected in parallel and mounted on the same semiconductor chip (not shown). The output of the power semiconductor device 100 is supplied from the three MOS FET 12a, 12b and 12c uniformly.

Reference characters 13a, 13b and 13c each denotes an output pad as the output terminal of the semiconductor device 100 connected to a source electrode of each power MOS FET 12a, 12b and 12c.

Reference number 14 designates an input terminal electrically connected to a gate electrode of each of the power MOS FETs 12a, 12b and 12c. A voltage power source V is applied to an drain electrode of each of them. Reference number 15 indicates an external terminal of the semiconductor device 100, and reference characters 16a, 16b and 16c designate bonding wires functioning as output conducting wires. The ends of each wire are connected to the output pads 13a, 13b and 13c and the external terminal 15, respectively.

In addition, each of over-current detection and protective circuits (also referred to as "over-current limiting means" or "over-current limiting circuit") 17a, 17b and 17c (OC) is incorporated between the source electrode (S) and the gate electrode (G) of each of the power MOS FETs 12a, 12b and 12c. Each of the over-current detection and protective circuits 17a, 17b and 17c makes up an over-current control section. These over-current detection and protective circuits 17a, 17b and 17c and the power MOS FETs 12a, 12b and 12c are formed on the same semiconductor chip (not shown). Each of the over-current detection and protective circuits 17a, 17b and 17c is a circuit which is capable of limiting the amount of current flowing through each source electrode (S) so that this current value at each source electrode (S) is not more than a desired allowable value determined for each of the bonding wires 16a, 16b and 16c. That is, the over-current detection and protective circuits 17b and 17c connected to the Power MOS FETs 12b and 12c, respectively, have the same configuration as the over-current detection and protective circuit 17a connected to the power MOS FET 12a shown in the schematic diagram of FIG. 2 in detail.

The over-current detection and protective circuit 17a comprises a P-type bipolar transistor 18, a N-type bipolar transistor 19 and a current detection section 20. The current detection section 20 comprises resistive elements 20a and 20b configured as a voltage divider which are located in parallel to wiring 21 that connects the source electrode (S) of the power MOS FET 12a to the output pad 13a in order to generate a detection signal. The current detection section 20 detects the amount of the current flowing through the source electrode of the power MOS FET 12a. When the amount of the current flowing through the source electrode of the power MOS FET 12a is over an allowable current value, the P-type transistor 18 operates (namely, enters an ON state or an activation state) based on this detection signal. Thereby, a voltage applied to the gate electrode of the power MOS FET 12a is limited (namely, decreased) so that the current value flowing through the source electrode of the power MOS FET 12a is not more than the maximum allowable current value.

In the semiconductor device 100 having the configuration described above, when there is no discontinuity in the bonding wires 16a, 16b and 16c and when the output pads 13a, 13b and 13c are electrically connected to the external terminal 15 correctly, substantially the same amount of current flows through each of the bonding wires 16a, 16b and 16c from each of the output pads 13a, 13b and 13c of the power MOS FETs 12a, 12b and 12c.

In this case, the current flowing through each of the bonding wires 16a, 16b and 16c is not over the maximum allowable current value in the active state of the semiconductor device 100 even if the semiconductor device 100 generates the maximum output.

For example, we will consider the following case that the bonding wire 16a is electrically cut, namely it enters an electrically disconnected state, or when the end of the bonding wire 16a is disconnected from the bonding pad 13a or from the external terminal 15, so that no current flows through the bonding wire 16a during the operation of a device or a system incorporating the semiconductor device 100 of the embodiment 1. In this case, the two power MOS FETs 12b and 12c operate and the current flows from the output pads 13b and 13c to the external terminal 15 through the other bonding wires 16b and 16c. This situation is also a normal operation state.

When an output value of the semiconductor device 100 is increased, the amount of the current flowing through the bonding wires 16b and 16c is also increased. When the amount of this current is approximately equal to the allowable current value, the over-current detection and protective circuits 17b and 17c enter the ON state and they limit the amount of the current so it is not over the maximum allowable current value.

Thereby, a fatal problem such as the stopping of the operation of the device or the system incorporating the semiconductor device 100 of the first embodiment can be avoided even if one of the bonding wires 16a, 16b and 16c is cut or disconnected from the bonding pads or from the external terminal by an unexpected accident.

In testing the operation of the semiconductor device 100 as the first embodiment before mounting it onto a device or a system, the following tests are performed:

Whether or not the operation of the semiconductor device 100 satisfies a desired specification is carried out using a testing current of an amount that is equal to the sum of the allowable currents flowing through all of the bonding wires 16a, 16b and 16c. When there is no problem in all of the three bonding wires 16a, 16b and 16c, same amount of current flows through each bonding wire.

On the other hand, when no current flows through one of the bonding wires 16a, 16b and 16c, for example, no current flows through the bonding wire 16a, both the over-current detection and protective circuits 17b and 17c enter ON state and operate in order to limit the amount of the current flowing through the bonding wires 16 and 16c, namely the amount of the current flowing through each of the bonding wires 16b and 16c is not over the maximum allowable current value. Thereby, a faulty bonding wire such as a disconnected bonding wire or a bonding wire having poor contact can be easily detected by checking the currents flowing in the power MOS FETs 12a, 12b and 12c.

Furthermore, in the semiconductor device 100 of this embodiment, it can be prevented to melt the bonding wire 16a if the resistance value of the bonding wire 16a is increased because the over-current detection and protective circuit 17a operates to prevent increasing of the voltage applied to the bonding wire 16a. The semiconductor device 100 can provide the same effect if the resistance value of each of the bonding wires 16b and 16c is increased.

Although the number of the external terminal is one for brevity in this embodiment, the present invention is not limited by this case, for example, the present invention can be applied to cases where the number of the external terminals is not less than one and the number of the bonding wires connected to one external terminal is one or more.

Embodiment 2.

Next, the configuration and the operation of a semiconductor device 200 of the second embodiment will be explained with reference to FIG. 3.

Figure 3:
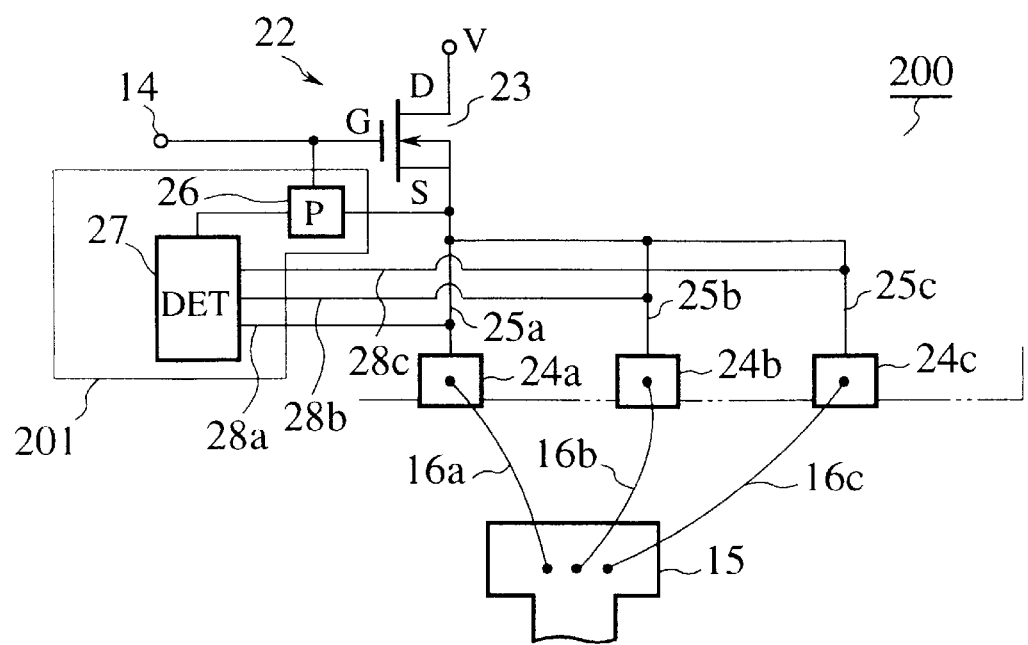
FIG. 3 is a circuit diagram showing a main part and a peripheral part of an output section in a semiconductor device of the second embodiment according to the present invention.

FIG. 3 is a circuit diagram showing a main part and a peripheral part of an output section in the semiconductor device 200 of the second embodiment according to the present invention. In the same diagram, a reference number 22 designates an output section of the semiconductor device 200. The output section 22 comprises a power MOS FET 23 as a power semiconductor element. A source electrode of the power MOS FET 23 is electrically connected to three output pads 24a, 24b and 24c as output terminals through wires 25a, 25b and 25c.

Each of the output pads 24a, 24b and 24c is connected to an external terminal 15 through each of bonding wires 16a, 16b and 16c whose ends are electrically bonded to the pads and terminal. In this configuration, output of the power MOS FET 23 is divided into each of the output pads 24a, 24b and 24c uniformly. That is, the current of substantially the same amount flows through each bonding wire.

In addition, a gate electrode of the power MOS FET 23 is connected to an over-current limiting section 201 comprising a protective circuit 26 (P) and a current detection circuit 27. The protective circuit 26 (P) is placed and electrically connected between a source electrode (S) and a gate electrode (G) of the power MOS FET 23. The protective circuit 26 receives a detection signal as a detection result transferred from the current detection circuit 27 (DET). In addition, the current detection circuit 27 is connected to detection wires 28a, 28b and 28c in order to detect an over-current flowing the bonding wires 16a, 16b and 16c or to detect a no current flow state of the bonding wires 16a, 16b and 16c.

The over-current limiting section 201, comprising the protective circuit 26 and the current detection circuit 27, generates a signal according to the current value flowing through the source electrode (S) of the power MOS FET 23 and transfers this signal to the gate electrode (G) of the power MOS FET 23 in order to limit the current flowing through the source electrode (S) so that the current value flowing through each of the bonding wires 16a, 16b and 16c remains less than a maximum allowable current value of each bonding wire. In addition, the over-current limiting section 201 and the power MOS FET 23 are formed on the same semiconductor chip in the second embodiment.

In the semiconductor device 200 having the configuration of the second embodiment described above, when there is no discontinuity in the bonding wires 16a, 16b and 16c and when the output pads 24a, 24b and 24c are electrically connected to the external terminal 15 correctly, the current of substantially the same amount flows through each of the bonding wires 16a, 16b and 16c from each of the output pads 24a, 24b and 24c of the power MOS FET 23. In this case, each amount of the current flowing through each of the bonding wires 16a, 16b and 16c is not over the maximum allowable current value even if the semiconductor device 200 supplies the maximum output.

For example, we will consider the following case that the bonding wire 16a is electrically disconnected, namely it enters a disconnected state, or when the end of the bonding wire 16a is disconnected from the bonding pad 24a or from the external terminal 15, so that no current flows through the bonding wire 16a during the operation of a device or a system incorporating the semiconductor device 200 of the embodiment 2. In this case, if the over-current limiting section 201 enters an OFF state (is not activated), all of the current flows through the bonding wires 16b and 16c that are electrically connected, so that the amount of the current flowing through the bonding wires 16b and 16c would be over the allowable current value. One or all of the bonding wires 16b and 16c will be blown, namely enter the disconnected state.

However, in the semiconductor device 200 of the second embodiment, the current detection circuit 27 in the over-current limiting section 201 detects the current value of the wiring paths 25b and 25c through the detection wires 28b and 28c. If a detection result indicates that the current value is approximately equal to or over the maximum allowable current value of each of the bonding wires 16b and 16c, the protective circuit 26 generates a signal corresponding to the detection result of the current detection circuit 27 and transfers the signal to the gate electrode (G) of the power MOS FET 23. The power MOS FET 23 receives the signal from the protective circuit 26 and decreases the output of the power MOS FET 23 is decreased so that the value of the current flowing through each of the bonding wires 16b and 16c remains less than the maximum allowable current value.

When the current detection circuit 27 in the over-current limiting section 201 detects through the detection line 28a that the value of the current flowing through the wire path 25a is zero, the protective circuit 26 generates a signal and transfers the signal to the gate electrode (G) of the power MOS FET 23 so that the value of the current (as the output of the power MOS FET 23) flowing through each of the bonding wires 16b and 16c is not over the allowable current value.

Thereby, like the semiconductor device 100 of the first embodiment, even if one or more of the bonding wires 16a, 16b and 16c is discontinuous, a fatal problem such as the stopping of the operation of the device or the system incorporating the semiconductor device 200 can be avoided.

In addition, in testing the operation of the semiconductor device 200 as the second embodiment before mounting it onto a device or a system, the following tests are performed:

Whether or not the operation of the semiconductor device 200 satisfies a desired specification is carried out, using a testing current of an current amount that is equal to the sum of the allowable currents flowing through all of the bonding wires 16a, 16b and 16c.

When there is no problem in all of three bonding wires 16a, 16b and 16c, the current of substantially the same amount flows through each bonding wire.

On the other hand, when no current flows through one of the bonding wires 16a, 16b and 16c, for example, no current flows through the bonding wire 16a, the protective circuit 26 and the current detection circuit 27 enter ON state and operate in order to limit the amount of the current flowing through the bonding wires 16b and 16c, namely the amount of the current flowing through the bonding wires 16b and 16c is not over the allowable current value. Thereby, a faulty bonding wire such as a disconnected bonding wire or a bonding wire having a poor contact part can be easily detected by checking the amount of current flowing in the power MOS FET 23.

Furthermore, in the semiconductor device 200 of this embodiment, it can be prevented to melt the bonding wire 16a if the resistance value of the bonding wire 16a is increased because the over-current detection and protective circuit 201 operates to prevent increasing of the voltage applied to the bonding wire 16a. The semiconductor device 200 can provide the same effect if the resistance value of each of the bonding wires 16b and 16c is increased.

Although the number of the external terminal is one for brevity in this embodiment, the present invention is not limited by this case, for example, the present invention can be applied to cases where the number of the external terminals is not less than one and the number of the bonding wires connected to one external terminal is one or more.

Embodiment 3.

Next, the configuration and the operation of a semiconductor device 300 of the third embodiment will be explained with reference to FIG. 4.

Figure 4:
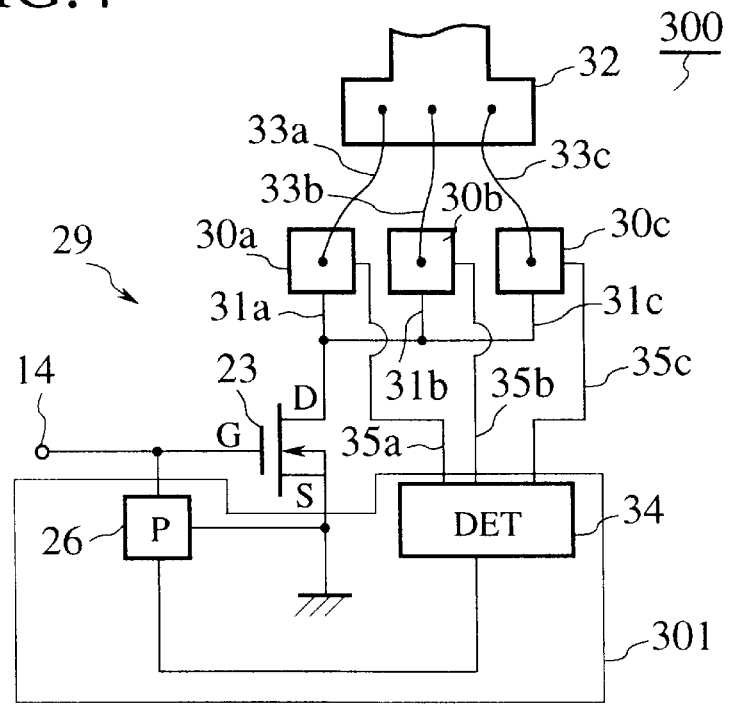
FIG. 4 is a circuit diagram showing a main part and a peripheral part of an output section in a semiconductor device of the third embodiment according to the present invention.

FIG. 4 is a circuit diagram showing a main part and a peripheral part of an output section in the semiconductor device of the third embodiment according to the present invention.

In the semiconductor device 300 of the third embodiment, an output terminal of the semiconductor device 300 is placed at the drain electrode side of a power MOS FET 23. This is the difference between the semiconductor device 300 of the third embodiment and the semiconductor device 200 of the second embodiment in configuration.

In FIG. 4, a reference number 29 designates the output section of the semiconductor device 300. The output section 29 comprises the power MOS FET 23 as a power semiconductor element. A drain electrode (D) of the power MOS FET 23 is electrically connected to three output pads 30a, 30b and 30c of the output terminal through wire paths 31a, 31b and 31c. The bonding wires 33a, 33b and 33c are electrically connected between the external terminal 32 and the output pads 30a, 30b and 30c.

Thereby, the output of the power MOS FET 23 is divided uniformly to each of the output pads 30a, 30b and 30c and the current of a substantially the same amount flows through each of the bonding wires 33a, 33b and 33c.

In addition, the gate electrode (G) of the power MOS FET 23 is connected to an over-current limiting section 301. The over-current limiting section 301 comprises a protective circuit 26 and a current detection circuit 34. The protective circuit 26 is placed between the source electrode (S) and the gate electrode (G) of the power MOS FET 23. The protective circuit 26 receives a detection signal transferred from the current detection circuit 34. The current detection circuit 34 is connected to detection wires 35a, 35b and 35c through which an over-current state or a disconnected state of the bonding wires 33a, 33b and 33c can be detected by measuring an amount of the current flowing through each of the bonding pads 30a, 30b and 30c.

The over-current limiting section 301, comprising the protective circuit 26 and the current detection circuit 34, generates a signal according to the current value flowing through the drain electrode (D) of the power MOS FET 23 and transfers this signal to the gate electrode (G) of the power MOS FET 23 in order to limit the current value flowing through the drain electrode (D) so that the current value flowing through each of the bonding wires 33a, 33b and 33c remains less than a maximum allowable current value of each bonding wire. In addition, the over-current limiting section 301 and the power MOS FET 23 are formed on a same semiconductor chip in the third embodiment.

In the semiconductor device 300 having the configuration of the third embodiment described above, when there is no discontinuity in the bonding wires 33a, 33b and 33c and when the output pads 30a, 30b and 30c are electrically connected to the external terminal 32 correctly, substantially the same amount of current flows through each of the bonding wires 33a, 33b and 33c from each of the output pads 30a, 30b and 30c of the power MOS FET 23. In this case, each amount of current flowing through each of the bonding wires 33a, 33b and 33c is not over the maximum allowable current value even if the semiconductor device 300 supplies the maximum output.

For example, we will consider the following case that the bonding wire 33a is electrically cut, namely it enters a disconnected state, or when the end of the bonding wire 33a is disconnected from the bonding pad 30a or from the external terminal 32, so that no current flows through the bonding wire 33a during the operation of a device or a system incorporating the semiconductor device 300 of the third embodiment. In this case, if the over-current limiting section 301 enters an OFF state (is not activated), all of the current flows through the bonding wires 33b and 33c that are electrically connected, so that the amount of the current flowing through the bonding wires 33b and 33c exceeds the maximum allowable current value. One or all of the bonding wires 33b and 33c will be blown.

However, in the semiconductor device 300 of the third embodiment, the current detection circuit 34 in the over-current limiting section 301 detects the current in the wiring paths 33b and 33c through the detection wires 35b and 35c. If a detection result indicates that the current value is approximately equal or over the maximum allowable current value of each of the bonding wires 33b and 33c, the protective circuit 26 generates a signal corresponding to the detection result of the current detection circuit 34 and transfers the signal to the gate electrode (G) of the power MOS FET 23. The power MOS FET 23 receives the signal from the protective circuit 26 and the output of the power MOS FET 23 is decreased so that the value of the current flowing through each of the bonding wires 33b and 133 becomes less than the maximum allowable current value.

When the current detection circuit 34 in the over-current limiting section 301 detects through the detection line 35a that the value of the current flowing through the wire path 35a is zero, the protective circuit 26 generates a signal and transfers the signal to the gate electrode (G) of the power MOS FET 23 so that the value of the current (as the output of the power MOS FET 23) flowing through each of the bonding wires 33b and 33c is not over the maximum allowable current value.

Thereby, like the semiconductor device 100 of the first embodiment, even if one or more of the bonding wires 33a, 33b and 33c is discontinuous, a fatal problem such as the stopping of the operation of the device or the system incorporating the semiconductor device 300 can be avoided.

In addition, in a testing process to test the operation of the semiconductor device 300 as the third embodiment before mounting it onto a device or a system, the following tests are performed:

Whether or not the operation of the semiconductor device 300 satisfies a desired specification is carried out, using a testing current of a current amount that is equal to the sum of the allowable currents flowing through all of the bonding wires 33a, 33b and 33c.

When there is no problem in all of three bonding wires 33a, 33b and 33c, the current of substantially the same amount flows through each bonding wire.

On the other hand, when no current flows through one of the bonding wires 33a, 33b and 33c, for example, no current flows through the bonding wire 33a, the protective circuit 26 and the current detection circuit 34 enter ON state and operate in order to limit the amount of the current flowing through the bonding wires, namely the amount of the current flowing through the bonding wires is not over the allowable current value. Thereby, a faulty bonding wire such as a disconnected bonding wire or a bonding wire having poor contact can be easily detected by checking of the amount of the current in the power MOS FET 23.

Furthermore, in the semiconductor device 300 of this embodiment, it can be prevented to melt the bonding wire 33a if the resistance value of the bonding wire 33a is increased because the over-current detection and protective circuit 301 operates to prevent increasing of the voltage applied to the bonding wire 33a. The semiconductor device 300 can provide the same effect if the resistance value of each of the bonding wires 33b and 33c is increased.

Although the number of the external terminal is one for brevity in this embodiment, the present invention is not limited by this case, for example, the present invention can be applied to cases where the number of the external terminals is not less than one and the number of the bonding wires connected to one external terminal is one or more.

Embodiment 4.

Next, the configuration and the operation of a semiconductor device 400 of the fifth embodiment will be explained with reference to FIG. 5.

Figure 5:
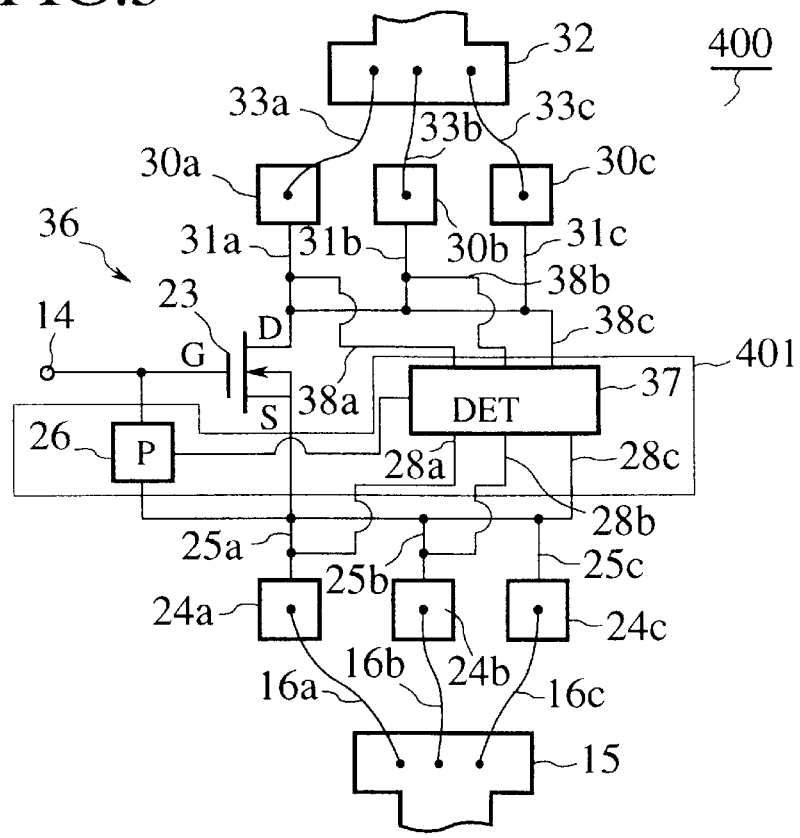
FIG. 5 is a circuit diagram showing a main part and a peripheral part of an output section in a semiconductor device of the fourth embodiment according to the present invention.

FIG. 5 is a circuit diagram showing a main part and a peripheral part of an output section in the semiconductor device of the fifth embodiment according to the present invention. An output terminal of the semiconductor device 400 is located at both sides of a source electrode (S) and a drain electrode (D) of a power MOS FET in the semiconductor device 400 of the fourth embodiment. This is different in configuration from the semiconductor devices 200 and 300 of the second embodiment and the third embodiment.

In FIG. 5, a reference number 36 designates the output section of the semiconductor device 400. The output section 36 comprises a power MOS FET 23 as a power semiconductor element. The source electrode (S) and the drain electrode (D) of the power MOS FET 23 are respectively connected to output pads 24a–c, and 30a–c, the output terminals through respective wire paths 25–c and 31a–c.

The ends of the bonding wires 16a–c and 33a–c are electrically bonded to the output pads 24a–c and 30a–c and external terminals 15 and 32, respectively. Thereby, output of the power MOS FET 23 is divided uniformly and provided to the output pads 24a, 24b, 24c, 30a, 30b and 30c. The same amount of current flows through each of the bonding wires 16a, 16b, 16c, 33a, 33b and 33c.

In addition, the gate electrode (G) of the power MOS FET 23 is connected to an over-current limiting section 401. The over-current limiting section 401 comprises a protective circuit 26 and a current detection circuit 37. The protective circuit 26 is placed between the source electrode (S) and the gate electrode (G) of the power MOS FET 23. The protective circuit 26 receives a detection signal transferred from the current detection circuit 37. The current detection circuit 37 is connected to detection wires 28a, 28b, 28c, 38a, 38b and 38c through which an over-current state or a disconnected state of the bonding wires 16a, 16b, 16c, 33a, 33b and 33c can be detected by detecting an amount of the current flowing through each of the bonding pads 24a, 24b, 24c, 30a, 30b and 30c.

The over-current limiting section 401, comprising the protective circuit 26 and the current detection circuit 37, generates a signal according to the current value flowing through the source electrode (S) of the power MOS FET 23 and transfers this signal to the gate electrode (G) of the power MOS FET 23 in order to limit the current flowing through the source electrode (S) so that the current flowing through each of the bonding wires 16a, 16b and 16c remains less than a maximum current value for each bonding wire. Further, the over-current limiting section 401 also generates the signal according to the current value flowing through the drain electrode (D) of the power MOS FET 23 and transfers this signal to the gate electrode (G) of the power MOS FET 23 in order to limit the current flowing through the drain electrode (D) so that the current flowing through each of the bonding wires 33a, 33b and 33c remains less than a maximum allowable current value for each bonding wire.

In addition, the over-current limiting section 401 and the power MOS FET 23 are formed on a same semiconductor chip in the fourth embodiment.

In the semiconductor device 400 having the configuration of the fourth embodiment described above, when there is no discontinuity in the bonding wires 16a, 16b, 16c, 33a, 33b and 33c and when the output pads 24a, 24b, 24c, 30a, 30b and 30c are electrically connected to the external terminals 15 and 32 correctly, the current of substantially the same amount flows through each of the bonding wires 16a, 16b, 16c, 33a, 33b and 33c from each of the output pads 24a, 24b, 24c, 30a, 30b and 30c of the power MOS FET 23. In this case, each amount of the current flowing through each of the bonding wires 16a, 16b, 16c, 33a, 33b and 33c is not over the maximum allowable current value even if the semiconductor device 400 supplies the maximum output.

For example, we will consider the following case that one of the bonding wires 16a, 16b, 16c, 33a, 33b and 33c is electrically discontinuous, namely it enters a disconnection state, or when the end of a wire is disconnected from the bonding pads 24a, 24b, 24c, 30a, 30b and 30c or from the external terminals 15 and 32, so that no current flows through the bonding wires during the operation of a device or a system incorporating the semiconductor device 400 of the fourth embodiment. In this case, if the over-current limiting section 401 enters OFF state (or is not activated), all of the current flows through the other bonding wires that are electrically connected, so that the amount of current flowing through the other bonding wires exceeds the maximum allowable current value. One or all of the other bonding wires will be blown.

However, in the semiconductor device 400 of the fourth embodiment, the current detection circuit 37 in the over-current limiting section 401 detects the current value of the wiring paths through the detection wires 28a, 28b, 28c, 38a, 38b and 38c. If a detection result indicates that the current value is approximately equal or over the allowable current value of each of the bonding wires or is zero, the protective circuit 26 generates a signal corresponding to the detection result of the current detection circuit 37 and transfers the signal to the source electrode (S) and the gate electrode (G) of the power MOS FET 23. The power MOS FET 23 receives the signal from the protective circuit 26 and the output of the power MOS FET 23 is decreased so that the value of the current flowing through each of the bonding wires 16a, 16b, 16c, 33a, 33b and 33c becomes less than the maximum allowable current value.

When the current detection circuit 37 in the over-current limiting section 401 detects through the detection line that the value of the current flowing through one or more of the wire paths is zero, the protective circuit 26 generates a signal and transfers the signal to the gate electrode (G) of the power MOS FET 23 so that the value of the current (as the output of the power MOS FET 23) flowing through each of the bonding wires that are electrically connected correctly is not over the maximum allowable current value. Thereby, like the semiconductor device 400 of the fourth embodiment, even if one or more of the bonding wires is disconnected, a fatal problem such as the stopping of the operation of the device or the system incorporating the semiconductor device 400 can be avoided.

Although the power MOS FET is used in the semiconductor devices 100 to 400 of the first to fourth embodiments, the present invention is not limited by them, for example, it is acceptable to use a bipolar transistor, an insulated gate bipolar transistor (IGBT) or the like as the output semiconductor element.

Furthermore, in the semiconductor device 400 of this embodiment, it can be prevented to melt the bonding wire 16a if the resistance value of the bonding wire 16a is increased because the over-current detection and protective circuit 401 operates to prevent increasing of the voltage applied to the bonding wire 16a. The semiconductor device 400 can provide the same effect if the resistance value of each of the bonding wires 16b–c and 33a–c is increased.

Although the number of the external terminal is one for brevity in this embodiment, the present invention is not limited by this case, for example, the present invention can be applied to cases where the number of the external terminals is not less than one and the number of the bonding wires connected to one external terminal is one or more.

Embodiment 5.

Next, the configuration and operation of a semiconductor device 500 of the fifth embodiment in which three power transistors are used as the power semiconductor elements will be discussed with reference to FIG. 6.

Figure 6:
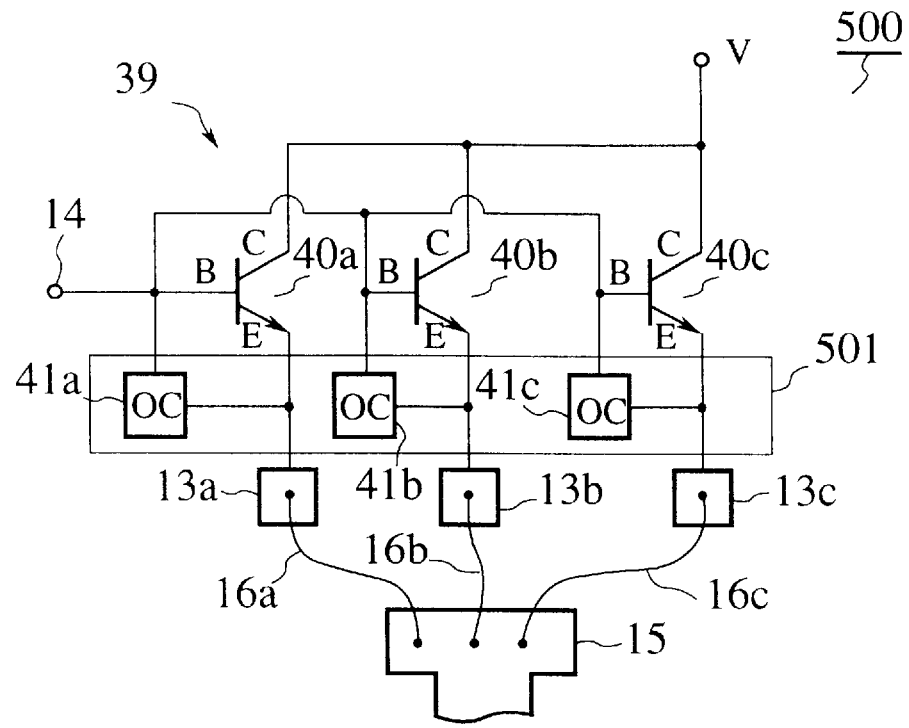
FIG. 6 is a circuit diagram showing a main part and a peripheral part of an output section in a semiconductor device of the fifth embodiment according to the present invention.
Figure 7:
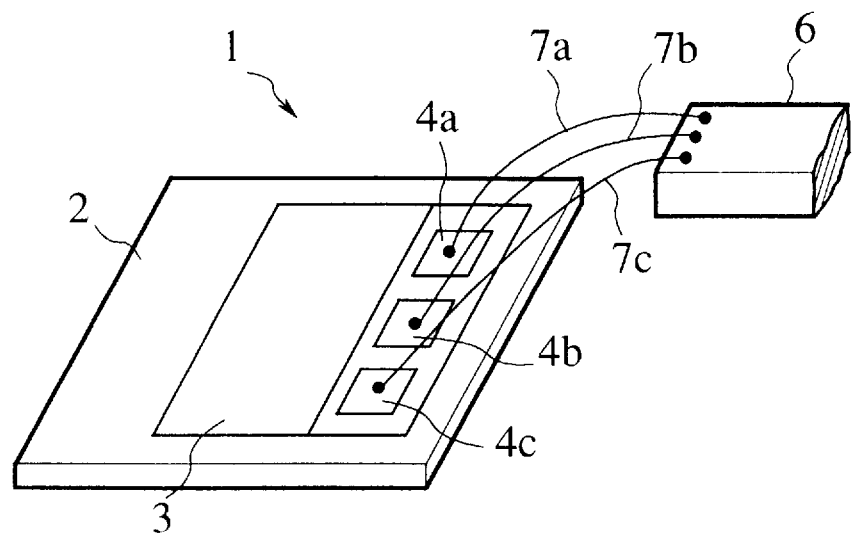
FIG. 7 is a perspective view showing a main part and a peripheral part of an output section of a semiconductor device as a first conventional example.
Figure 8:
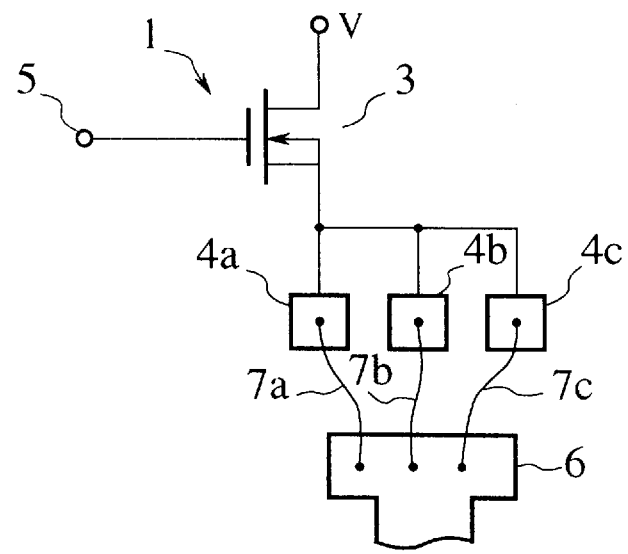
FIG. 8 is a circuit diagram showing a main part and a peripheral part of an output section in the conventional semiconductor device as shown in FIG. 7.
Figure 9:
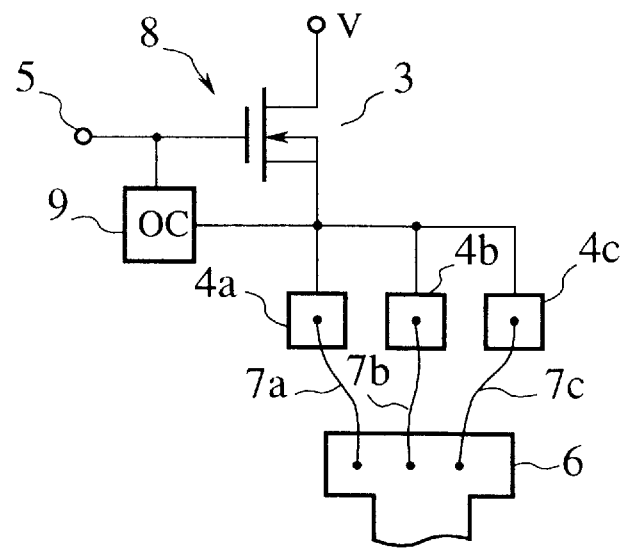
FIG. 9 is a perspective view showing a main part and a peripheral part of an output section of a semiconductor device as a second conventional example.

FIG. 6 is a circuit diagram showing a main section and a peripheral part of an output section in the semiconductor device 500 of the fifth embodiment according to the present invention.

In FIG. 6, a reference number 39 designates an output section of the semiconductor device 500. The semiconductor device 500 comprises power transistors 40a, 40b and 40c as three power semiconductor elements connected in parallel and formed on the same semiconductor chip (not shown).

An output from the output section 39 in the semiconductor device 500 is divided uniformly and supplied from the power transistors 40a, 40b and 40c. Emitter electrodes of the power transistors 40a, 40b and 40c are connected to output pads 13a, 13b and 13c as the output terminals, respectively.

In addition, the base electrodes (B) of the power MOS FET 40a, 40b and 40c are commonly connected to input terminal 14. A voltage V is applied to each of collector electrodes (C) of the power transistors 40a, 40b and 40c.

Like the semiconductor device 100 of the first embodiment, bonding wires 16a, 16b and 16c are connected between the external terminal 15 of the output section 39 in the semiconductor device 500 and the output pads 13a, 13b and 13c, respectively.

In addition, each of over-current detection and protective circuits 41a, 41b and 41c (OC) making up an over-current limiting section 501 is incorporated between the emitter electrode (E) and the base electrode (B) of each of the power transistors 40a, 40b and 40c, respectively.

These over-current detection and protective circuits 41a, 41b and 41c and the power transistors 40a, 40b and 40c are formed on the same semiconductor chip (not shown). Each of the over-current detection and protective circuits 41a, 41b and 41c is a circuit which is capable of limiting the amount of current flowing through each emitter electrode (E) so that this current value at each emitter electrode (E) is not more than a desired allowable value determined for each of the bonding wires 16a, 16b and 16c. In the semiconductor device 400 of the fifth embodiment having the configuration described above, when there is no discontinuity in the bonding wires 16a, 16b and 16c and when the output pads 13a, 13b and 13c are electrically connected to the external terminal 15 correctly, the current of substantially the same amount flows through each of the bonding wires 16a, 16b and 16c from each of the output pads 13a, 13b and 13c of the power transistors 40a, 40b and 40c. In this case, the amount of the current flowing through each of the bonding wires 16a, 16b and 16c is not over the maximum allowable current value in the active state of the semiconductor device 500 even if the semiconductor device 500 generates the maximum output.

For example, we will consider the following case that the bonding wire 16a is electrically discontinuous, namely it enters a disconnected state, or when the end of the bonding wire 16a is disconnected from the bonding pad 13a or from the external terminal 15, so that no current flows through from the bonding wire 16a during the operation of a device or a system incorporating the semiconductor device 500 of embodiment 5. In this case, the two power transistors 40b and 40c operate and the current flows from the output pads 13b and 13c to the external terminal 15 through the other bonding wires 16b and 16c. This state is also the normal operation state.

When the output of the semiconductor device 500 is increased, the amount of the current flowing through the bonding wires 16b and 16c is also increased. When the amount of this current is approximately equal to the allowable current value, the over-current detection and protective circuits 41b and 41c turn ON and limit the amount of the current so it is not be over the maximum allowable current value.

Thereby, a fatal problem such as the stopping of the operation of a device or a system incorporating the semiconductor device 500 of the fifth embodiment can be avoided even if one of the bonding wires 16a, 16b and 16c is cut or disconnected from the bonding pads or from the external terminal by an unexpected accident.

In a testing the operation of the semiconductor device 500 as the fifth embodiment before mounting it onto a device or a system, the following tests are performed:

Whether or not the operation of the semiconductor device 500 satisfies a desired specification is carried out, using a testing current that is equal to the sum of the maximum allowable currents flowing through all of the bonding wires flows through the bonding wires 16a, 16b and 16c. When there is no problem in the all of three bonding wires 16a, 16b and 16c, substantially the same amount of current flows through each bonding wire.

On the other hand, when no current flows through one of the bonding wires 16a, 16b and 16c, for example, no current flows through the bonding wire 16a, the over-current detection and protective circuits 41b and 41c turn ON and operate in order to limit the amount of the current flowing through the bonding wires so that the amount of the current is not over the maximum allowable current value. Thereby, a faulty bonding wire such as a disconnected bonding wire or a bonding wire having poor contact can be easily detected by checking the current flowing in the power transistors 40a, 40b and 40c.

Furthermore, in the semiconductor device 500 of this embodiment, it can be prevented to melt the bonding wire 16a if the resistance value of the bonding wire 16a is increased because the over-current detection and protective circuit 501 operates to prevent increasing of the voltage applied to the bonding wire 16a. The semiconductor device 500 can provide the same effect if the resistance value of each of the bonding wires 16b and 16c is increased.

Although the number of the external terminal is one for brevity in this embodiment, the present invention is not limited by this case, for example, the present invention can be applied to cases where the number of the external terminals is not less than one and the number of the bonding wires connected to one external terminal is one or more.

As described above in detail, the semiconductor devices of the present invention have the configurations in which a current flowing through each of the plurality of output conducting wires (bonding wires) connecting the output terminals to the external terminal is limited by the over-current limiting section so that the value of the current is not over a maximum allowable current value. Thereby, it can be prevent to blowing the output conducting wires can be prevented and no current over the maximum allowable current value flows through the output conducting wires. When the semiconductor devices of the present invention are mounted on a device or a system, a fatal problem such as the stopping of the operation of the device or the system incorporating the semiconductor devices of the present invention can be avoided and a faulty bonding wire such as a disconnected bonding wire or a bonding wire having poor contact can be easily detected.

While the above provides a full and complete disclosure of the preferred embodiment of the present invention, various modifications, alternate constructions and equivalents any be employed without departing from the true spirit and scope of the invention. Therefore the above description and illustration should not be construed as limiting the scope of the present invention, which is defined by the appended claims.

What is claimed is:

1. A semiconductor device having an input terminal and an output terminal, comprising:
   at least one high power semiconductor element of the semiconductor device for supplying output current as an output section; and
   a plurality of over-current limiting circuits for limiting an amount of current flowing through a plurality of output conducting wires by which the output terminal is connected to one common external terminal, said over-current limiting circuits being provided for their respective output conducting wires in a one-to-one correspondence in order to prevent the current passing through each of said output conducting wires from exceeding an allowable level for said each of said output conducting wires, so as to determine that said each of said output conducting wires is broken when a current passing therethrough exceeds the allowable level.

2. A semiconductor device as claimed in claim 1, wherein, the over-current limiting means comprises:

current detection means for detecting an amount of the current flowing through the plurality of output conducting wires; and protective circuit means for receiving an output transferred from the current detection means and for controlling the amount of an output current of the high power semiconductor element according to the output of the current detection means so that the amount of the current flowing each of through the plurality of output conducting wires does not exceed said allowable limit.

3. A semiconductor device as claimed in claim 2, wherein the protective circuit means comprises:

a first conductivity type Transistor whose first terminal is connected to the input terminal and whose second terminal is connected to a ground; and a second conductivity type Transistor is connected to the high power semiconductor element and is connected to the high power semiconductor element and the ground through a resistive element, wherein the current detection means in the over-current limiting means comprises the resistive element.

4. A semiconductor device as claimed in claim 3, wherein the first conductivity type Transistor is a P type and the second conductivity type Transistor is a N type.

5. A semiconductor device as claimed in claim 1, wherein a respective over-current limiting means is provided for each of the plurality of high power semiconductor elements.

6. A semiconductor device as claimed in claim 2, wherein the over-current limiting means is incorporated in each of the plurality of high power semiconductor elements.

7. A semiconductor device as claimed in claim 1, wherein the output terminal of the high power semiconductor element is the source terminal, the input terminal of the high power semiconductor element is the gate terminal, and the drain terminal of the high power semiconductor element is connected to a high voltage power source.

8. A semiconductor device as claimed in claim 1, wherein each output terminal of each of the plurality of high power semiconductor elements is electrically connected to each of the plurality of output conducting wires.

9. A semiconductor device as claimed in claim 1, wherein each output terminal of the plurality of high power semiconductor elements is connected to at least two of said output conducting wires, and the over-current limiting means detects each of the currents flowing through said at least two output conducting wires.

10. A semiconductor device as claimed in claim 1, wherein the output terminal of said device is the drain terminal of the high power semiconductor element and the input terminal is the gate terminal of the high power semiconductor element, and the source terminal and the gate terminal of the high power semiconductor element are connected to the over-current limiting means.

11. A semiconductor device as claimed in claim 1, wherein the output terminal has first and second output terminals, said first terminal being connected to the drain terminal of the high power semiconductor element, and said second terminal being connected to the source terminal, and the over-current limiting means detects the amount of the current flowing through at least one of output conducting wires connected to the second output terminal.

12. A semiconductor device as claimed in claim 1, wherein each of the plurality of high power semiconductor elements comprises a power MOS FET.

13. A semiconductor device as claimed in claim 1, wherein each of the plurality of high power semiconductor elements comprises a bipolar transistor.

14. A semiconductor device as claimed in claim 1, wherein each of the plurality of high power semiconductor elements comprises an insulated gate bipolar transistor (IGBT).

15. A semiconductor device as claimed in claim 1, wherein each of the plurality of high power semiconductor elements comprises a high power Metal Oxide Semiconductor Field Effect Transistor (MOS FET).

16. In a power semiconductor device having a plurality of bonding pads and an external terminal with an over-current limiting circuit, said plurality of bonding pads being connected commonly to said external terminal through a plurality of wires, said over-current limiting circuit comprising:

a current detection circuit for separately detecting partial currents passing respectively through said wires; and a protective circuit provided for preventing a total current as a sum of currents passing through said wires from increasing to exceed an allowable level, wherein said allowable level is predetermined so that each of said wires is determined to be broken when a corresponding partial current passing therethrough exceeds the allowable level.

* * * * *